US012106438B2

(12) United States Patent
Niigaki et al.

(10) Patent No.: US 12,106,438 B2
(45) Date of Patent: Oct. 1, 2024

(54) POINT CLOUD ANNOTATION DEVICE, METHOD, AND PROGRAM

(71) Applicant: NIPPON TELEGRAPH AND TELEPHONE CORPORATION, Tokyo (JP)

(72) Inventors: Hitoshi Niigaki, Tokyo (JP); Yasuhiro Yao, Tokyo (JP); Shingo Ando, Tokyo (JP); Kana Kurata, Tokyo (JP); Atsushi Sagata, Tokyo (JP)

(73) Assignee: NIPPON TELEGRAPH AND TELEPHONE CORPORATION, Tokyo (JP)

(*) Notice: Subject to any disclaimer, the term of this patent is extended or adjusted under 35 U.S.C. 154(b) by 224 days.

(21) Appl. No.: 17/608,735

(22) PCT Filed: May 8, 2019

(86) PCT No.: PCT/JP2019/018452
§ 371 (c)(1),
(2) Date: Nov. 3, 2021

(87) PCT Pub. No.: WO2020/225889
PCT Pub. Date: Nov. 12, 2020

(65) Prior Publication Data
US 2023/0260216 A1 Aug. 17, 2023

(51) Int. Cl.
G06T 19/00 (2011.01)
G06T 7/00 (2017.01)

(52) U.S. Cl.
CPC .......... *G06T 19/00* (2013.01); *G06T 7/0002* (2013.01); *G06T 2200/24* (2013.01);
(Continued)

(58) Field of Classification Search
None
See application file for complete search history.

(56) References Cited

U.S. PATENT DOCUMENTS 9,144,905 B1* 9/2015 Sinapov ................. B25J 9/1671
10,699,167 B1* 6/2020 Dowdall ............. G06F 18/2178
(Continued)

FOREIGN PATENT DOCUMENTS

CN 109726749 A * 5/2019

OTHER PUBLICATIONS

Niigaki et al. (2017) "Detection of Tree Trunk using 3D Point Cloud measured by Mobile Mapping System—Feature Extraction for Sweep Object Detection" The Institute of Image Electronics Engineers of Japan, Visual/Media Computing Conference, Jun. 23, 2017.
(Continued)

*Primary Examiner* — Frank S Chen

(57) ABSTRACT

Annotation can be easily performed on a three-dimensional point cloud and a working time can be reduced. An interface unit 22 displays a point cloud indicating a three-dimensional point on an object, and receives designation of a three-dimensional point indicating an annotation target object and designation of a three-dimensional point not indicating the annotation target object. A candidate cluster calculation unit 32 calculates a value of a predetermined evaluation function indicating a likelihood of a point cloud cluster being the annotation target object based on the designation of a three-dimensional point for point cloud clusters obtained by clustering the point clouds. A cluster selection and storage designation unit 34 causes the interface unit 22 to display the point cloud clusters in descending order of the value of the evaluation function, and receives a selection of a point cloud cluster to be annotated. An annotation execution unit 36 executes annotation indicating the annotation target object for each three-dimensional point included in the selected point cloud cluster.

20 Claims, 13 Drawing Sheets

(52) U.S. Cl.
CPC .............. *G06T 2207/10028* (2013.01); *G06T 2207/20092* (2013.01); *G06T 2210/56* (2013.01); *G06T 2219/004* (2013.01)

(56) References Cited

U.S. PATENT DOCUMENTS

| | | | | |
|---|---|---|---|---|
| 2012/0254179 A1* | 10/2012 | Cao | ........................ | G06Q 30/02 707/E17.089 |
| 2014/0098989 A1* | 4/2014 | Datta | ...................... | G06T 7/248 382/103 |

OTHER PUBLICATIONS cloudcompare.org (2021) "CloudCompare 3D point cloud and mesh processing software Open Source Project" [online] Accessed on Oct. 10, 2021(Reading Day), website: https://www.danielgm.net/cc/.

Github, Inc. (2021) "GitHub—kyamagu/js-segment-annotator" [online] Accessed on Oct. 10, 2021(Reading Day), website: https://github.com/kyamagu/js-segment-annotator.

* cited by examiner

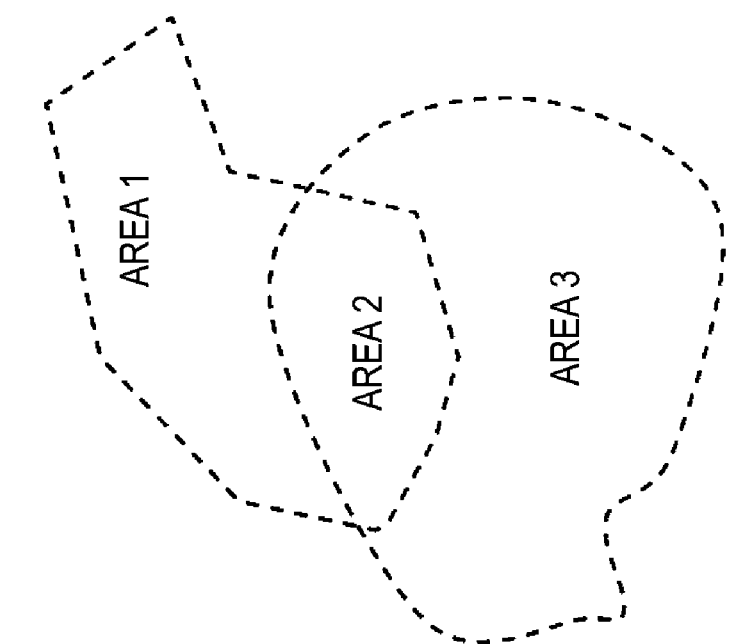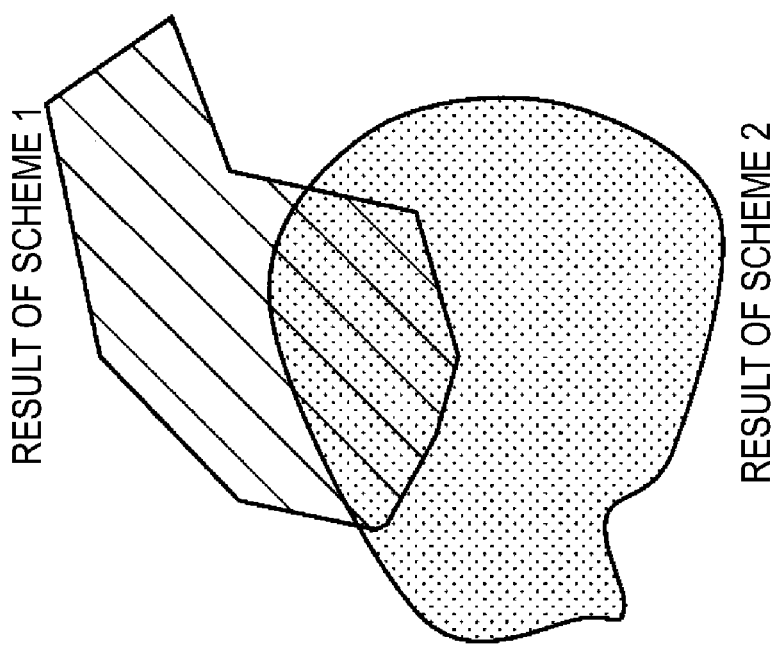
Fig. 2

POINT CLOUD ANNOTATION DEVICE, METHOD, AND PROGRAM

CROSS-REFERENCE TO RELATED APPLICATIONS

This application is a U.S. National Stage Application filed under 35 U.S.C. § 371 claiming priority to International Patent Application No. PCT/JP2019/018452, filed on 8 May 2019, the disclosure of which is hereby incorporated herein by reference in its entirety.

TECHNICAL FIELD

The present invention relates to a point cloud annotation device, method, and program, and more particularly, to a point cloud annotation device, method, and program for performing an annotation on a point cloud including three-dimensional points.

BACKGROUND ART

In recent years, use of a system capable of measuring a shape of a surface of an object or structure around a road such as a road surface or a building by a vehicle with a camera or a laser scanner, called a mobile mapping system (MMS), while traveling around a city has become widespread. This system can record the surface of the object as three-dimensional coordinate information using a global positioning system (GPS) or an inertial measurement unit (IMS). Using this technology, facilities around the road can be stored as a three-dimensional point cloud.

A three-dimensional point cloud is analyzed and machine learning is used so that an object can be detected from an input point cloud, as in Non Patent Literature 1. For example, research and development on support of creation of a DB for a 3D map for automated driving or a map of infrastructure facilities around a road is being performed.

However, it is necessary to perform manual annotation in advance in order to use an automatic detection technology for these objects. Annotation means a task for imparting information on an object to be detected to input data.

Further, a method of performing annotation to a point cloud through an operation of three-dimensional data visualization software such as CAD is known (Non Patent Literature 2). In this method, it is necessary to visually find a point cloud to be cut out and perform an operation in a viewpoint direction that does not overlap other subjects. Positions of point clouds of a subject that is an annotation target are selected through an operation of a mouse or the like, and annotation is performed these point clouds.

Further, a method of clicking on an over-divided area in an annotation task as teacher data for machine learning of a two-dimensional image recognition technology is used (Non Patent Literature 3).

CITATION LIST

Non Patent Literature

Non Patent Literature 1: Hitoshi Nigaki, Ken Tsutsuguchi, Tetsuya Kinebuchi, "Detection of Tree Trunks from Mobile Mapping System Measurement Point Cloud—Feature Extraction for Sweep Shape Object Detection—", 45th Annual Meeting of The Institute of Image Electronics Engineers of Japan Non Patent Literature 2: "Cloud Compare: 3D point cloud and mesh processing software, Open Source Project", [retrieved on Mar. 7, 2019], Internet (URL: https://www.danielgm.net/cc/)

Non Patent Literature 3: "GitHub-kyamagu/js-segment-annotator", [retrieved on Mar. 7, 2019], Internet (URL: https://github.com/kyamagu/js-segment-annotator)

SUMMARY OF THE INVENTION

Technical Problem

However, impartment of information to a three-dimensional point cloud through an operation in software such as CAD, as in software described in Non Patent Literature 2 causes many structures to be shown as overlapping each other as compared with a two-dimensional image and thus, it is difficult to select a subject that is an annotation target object and it is likely that an operating time will become long. A task for manually cutting out (dividing) a point cloud in a scene in which subjects are dense is effective, but it is necessary for a cutting-out operation to be supported on a two-dimensional PC screen and thus, it is necessary to repeatedly execute an operation of finding and cutting out directions of a viewpoint position and a gazing point position in which subjects do not overlap as much as possible. Here, the viewpoint position is a camera position when point cloud data is displayed on a screen, the gazing point position means a position of the subject, and "the subjects do not overlap" means that there are no other structures on a line segment connecting the viewpoint and the gazing point.

As a method of realizing annotation without cutting out point clouds, when the annotation is performed, a divided area is selected (designated) such that annotation can be executed for pixels of many images or a three-dimensional point cloud at a time, as in a method described in Non Patent Literature 3.

However, with this method, when the number of divided areas is large, there is also a problem in which the number of operations for designation (for example, click operations) increases and working time increases. In general, when a scene becomes more complicated, that is, when there are many subjects or when a subject of interest and a surrounding structure are in contact with each other, the number of areas tends to increase at the time of automatic division. Further, when the accuracy of generation of the divided area is poor in the first place, it is necessary to manually correct the divided area itself, and operations become more numerous accordingly.

The present invention has been made in consideration of the above problems, and an object of the present invention is to provide a point cloud annotation device, method, and program capable of easily performing an annotation on a three-dimensional point cloud and reducing working time.

Means for Solving the Problem

In order to achieve the above object, a point cloud annotation device according to a first aspect of the present invention includes an interface unit configured to display point clouds indicating three-dimensional points on an object and receive designation of a three-dimensional point indicating an annotation target object and designation of a three-dimensional point not indicating the annotation target object; a candidate cluster calculation unit configured to calculate a value of a predetermined evaluation function indicating a likelihood of a point cloud cluster being the annotation target object based on the designation of a three-dimensional point for point cloud clusters obtained by clustering the point clouds; a cluster selection and storage designation unit configured to cause the interface unit to display the point cloud clusters in descending order of the value of the evaluation function and receive a selection of a point cloud cluster to be annotated; and an annotation execution unit configured to execute an annotation indicating the annotation target object for each three-dimensional point included in the selected point cloud cluster.

A point cloud annotation method according to a second aspect of the present invention includes receiving, by an interface unit, designation of a three-dimensional point indicating an annotation target object and designation of a three-dimensional point not indicating the annotation target object from point clouds that are displayed, the point clouds indicating three-dimensional points on an object; calculating, by a candidate cluster calculation unit, a value of a predetermined evaluation function indicating a likelihood of a point cloud cluster being the annotation target object based on the designation of a three-dimensional point for point cloud clusters obtained by clustering the point clouds; receiving, by a cluster selection and storage designation unit, selection of a point cloud cluster to be annotated from the point cloud clusters displayed in descending order of the value of the evaluation function; and executing, by an annotation execution unit, an annotation indicating the annotation target object for each three-dimensional point included in the selected point cloud cluster.

Further, a program according to a third aspect of the present invention is a program for causing a computer to execute: receiving designation of a three-dimensional point indicating an annotation target object and designation of a three-dimensional point not indicating the annotation target object from point clouds that are displayed, the point clouds indicating three-dimensional points on an object; calculating a value of a predetermined evaluation function indicating a likelihood of a point cloud cluster being the annotation target object based on the designation of a three-dimensional point for point cloud clusters obtained by clustering the point clouds; receiving a selection of a point cloud cluster to be annotated from the point cloud clusters displayed in descending order of the value of the evaluation function; and executing an annotation indicating the annotation target object for each three-dimensional point included in the selected point cloud cluster.

Effects of the Invention

According to the point cloud annotation device, method, and program according to an aspect of the present invention, effects that it is possible to easily perform annotation on a three-dimensional point cloud and to reduce a working time are obtained.

BRIEF DESCRIPTION OF DRAWINGS

FIG. 2 is a diagram illustrating a method of generating a point cloud cluster.

DESCRIPTION OF EMBODIMENTS

Figure 1:
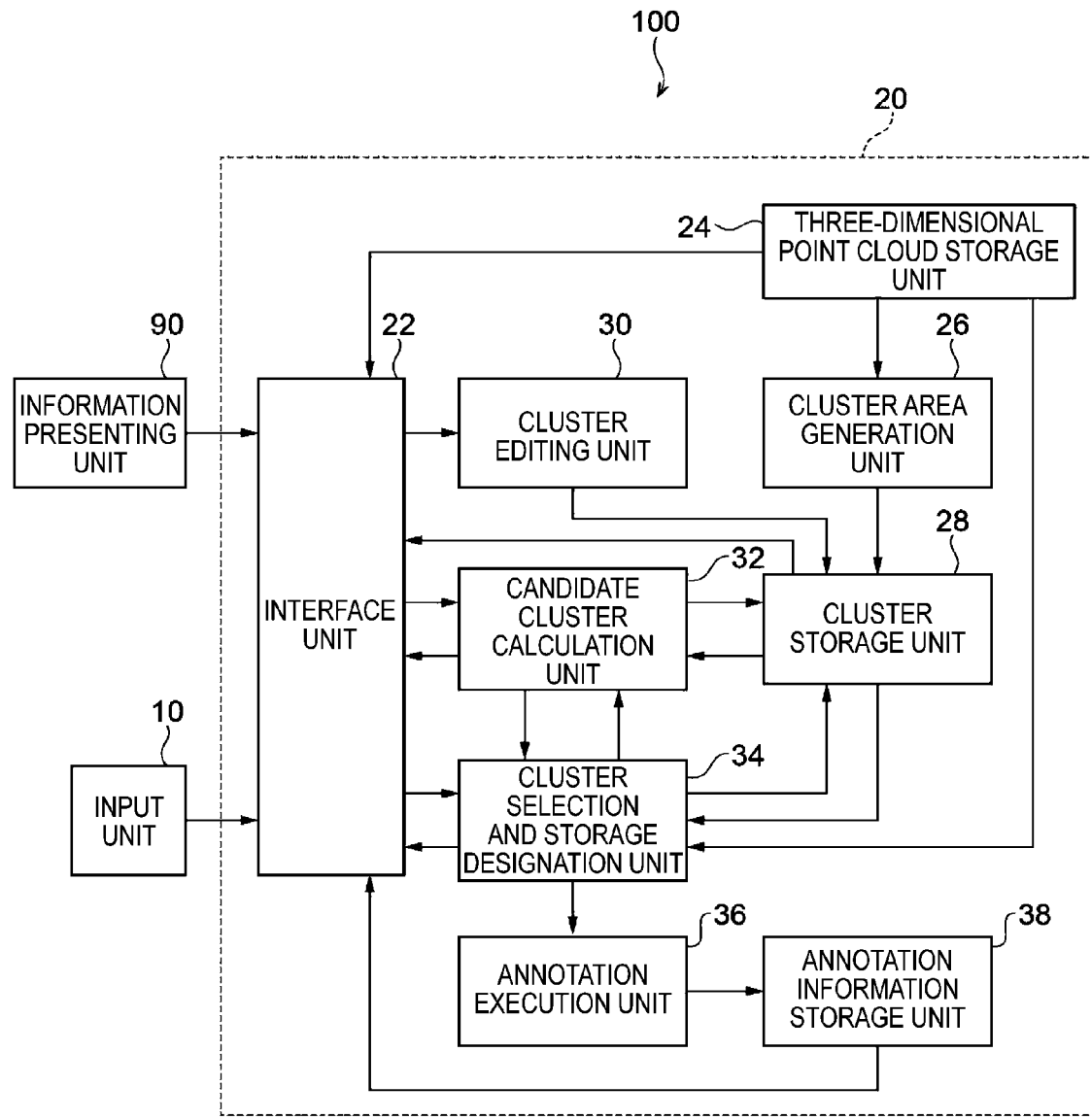
FIG. 1 is a configuration diagram illustrating an example of a schematic configuration of a point cloud annotation device according to an embodiment of the present invention.

Hereinafter, embodiments of the present invention will be described in detail with reference to the drawings. The embodiments do not limit the present invention.

Overview

First, an overview of an embodiment of the present invention will be described.

In a point cloud annotation device according to the embodiment of the present invention, it is possible to create a point cloud cluster indicating a large area by simply clicking a three-dimensional point included in the point cloud, and to perform batch annotation using the point cloud cluster.

Here, the point cloud cluster means a group of point clouds in which input three-dimensional point clouds are grouped using physical information such as a distance or color as an index. For example, grouping (called clustering) can be performed based on a distance threshold value or a threshold value of a difference value in laser reflection intensity.

Further, the point cloud annotation device calculates a value of the evaluation function as follows and presents the point cloud clusters to a user in descending order of the value of the evaluation function. In the calculation of the evaluation function, it is considered whether the candidate cluster is a point cloud cluster including a point (called a positive example) clicked as a three-dimensional point indicating an annotation target object or a cluster not including a point (called a negative example) clicked as a three-dimensional point not indicating the annotation target object.

In the present invention, annotation is defined as impartment of information (type) on an object to each point. A measured point cloud holds three-dimensional information, but it is unknown which object surface the point is on. Therefore, the point cloud annotation device imparts, for example, a number (an integer value) as information indicating which object each point is on. When annotation is performed on a plurality of types of target objects, this means that different numbers are imparted for different types of target objects, for example, 10 being imparted to a utility pole and 20 being imparted to a cable.

Further, there is generally no algorithm capable of definitely correctly clustering input data of various measurement scenes. That is, because there is a difference in a distance from a measurement position or there is a variation in an influence of noise, there is no guarantee that a result of only one clustering will completely separate each subject and there is no guarantee that a result of clustering an input point cloud once is an optimal result. In a clustering result using one clustering scheme, even when a good point cloud cluster is obtained for a specific object, the good point cloud cluster cannot often be obtained for other objects. Therefore, in the point cloud annotation device according to the embodiment, the user clicks on several points to designate the three-dimensional point (the positive example) indicating the target object or the three-dimensional point (the negative example) not indicating the target object, the point cloud cluster with a high percentage of matching with designation content of the user is displayed as a good candidate, and the user designates an optimum point cloud cluster with respect to a result of the display so that clusters optimal for the respective subjects can be annotated in a batch.

Even in a state in which an area is over-divided, the user are clicks on and designates points at positions from the point cloud far away from each other on the same subject as correct examples so that a cluster including both the positive examples is automatically selected as a candidate and thus, it is possible to greatly reduce a task for cutting out a point cloud and clicking a large number of areas.

An evaluation equation for candidate clusters can be obtained by the following equation.

$$E = \Sigma(\text{number of positive examples included in cluster}) - \Sigma(\text{number of negative examples included in cluster}) \quad [\text{Math. 1}]$$

Clustering may be performed in the middle of a task or may be performed in advance. There is a characteristic in that a calculation load is small because calculation for determining whether or not the candidate cluster is a point cloud cluster desired by the user can also be performed simply through calculation for counting the number of clusters including points of positive examples and the number of clusters not including points of negative examples, that is, addition and subtraction.

Configuration of Point Cloud Annotation Device 100 of Embodiment of the Present Invention Next, a configuration of the point cloud annotation device of the present embodiment will be described.

As illustrated in FIG. 1, a point cloud annotation device 100 of the present embodiment includes an input unit 10, a calculation unit 20, and an information presenting unit 90.

The input unit 10 is a user interface such as a mouse or a keyboard, and receives an operation of a user with respect to the GUI screen displayed by the information presenting unit 90.

The information presenting unit 90 displays the GUI screen to the user.

The calculation unit 20 includes an interface unit 22, a three-dimensional point cloud storage unit 24, a cluster area generation unit 26, a cluster storage unit 28, a cluster editing unit 30, a candidate cluster calculation unit 32, a cluster selection and storage designation unit 34, an annotation execution unit 36, and an annotation information storage unit 38.

The interface unit 22 draws a GUI screen that is displayed by the information presenting unit 90, and ascertains details of the operation of the user received by the input unit 10.

The three-dimensional point cloud storage unit 24 stores a point cloud that is a set of three-dimensional points on an object, which is measured by a device that measures a three-dimensional point cloud in advance. The device that measures a three-dimensional point cloud is, for example, a device that is mounted on a moving body and measures point clouds indicating three-dimensional points on an object, and is a device capable of measuring a distance between a subject and a sensor, such as a laser range finder, an infrared sensor, or an ultrasonic sensor. For example, the laser range finder is mounted in a vehicle with a GPS or on an airplane with a GPS, and measurement is performed during of movement of the vehicle or airplane, for measurement of a three-dimensional position of a surface of a subject, which is a feature in an outdoor environment, such as a cable, a building, a guardrail, a road ground, or the like.

The cluster area generation unit 26 clusters the point clouds indicating the three-dimensional points on the object stored in the three-dimensional point cloud storage unit 24 to obtain point cloud clusters, and generates a large number of point cloud clusters through an AND or OR process between the point cloud clusters.

In the present embodiment, the point cloud cluster is obtained from a result of clustering the point clouds using a plurality of clustering schemes. For example, in a scheme of Non Patent Literature 1, it is only required to use a large number of point cloud clusters generated when a threshold parameter of clustering is changed.

Next, when an area indicating a point cloud cluster obtained using clustering scheme 1 and an area indicating a point cloud cluster obtained using clustering scheme 2 overlap as illustrated in FIG. 2, a total of three areas including area 1, area 2, and area 3 are obtained as over-divided areas, area 2 is obtained as an AND area, an area that is a combination of areas 1 to 3 is obtained as an OR area, and these are used as point cloud clusters.

The cluster area generation unit 26 does not necessarily have a function of performing a clustering process, and may read a result of clustering performed in advance and use the clustering result (point cloud clusters) to generate point cloud clusters in an AND area and the OR area.

An AND process is a process for division into the common spatial area portion and other areas when a certain cluster A and another cluster B are targets, and as a result, three (two when there is no common spatial area) point cloud clusters are generated. One point cloud cluster is forcibly generated as the OR area.

Here, the "area" means a range of positions in a three-dimensional space. Specifically, it is only required that a position and a size in an XYZ space is designated. In the description of the present example, a "point cloud cluster" is used with a meaning of information (area) for specifying an area, but the area may be designated using information other than the point cloud cluster.

Further, the purpose of this cluster area generation is to prepare a large number of candidate clusters that are used at the time of annotation. Therefore, it is only required that a large number of combinations of point cloud clusters that are targets of the AND process and the OR process is randomly selected. For example, in Non Patent Literature 1, for 100 clustering results obtained by performing clustering while changing a parameter 100 times, it is only required that the AND process and the OR process are performed on a combination of point cloud clusters including at least one common point.

Figure 3:
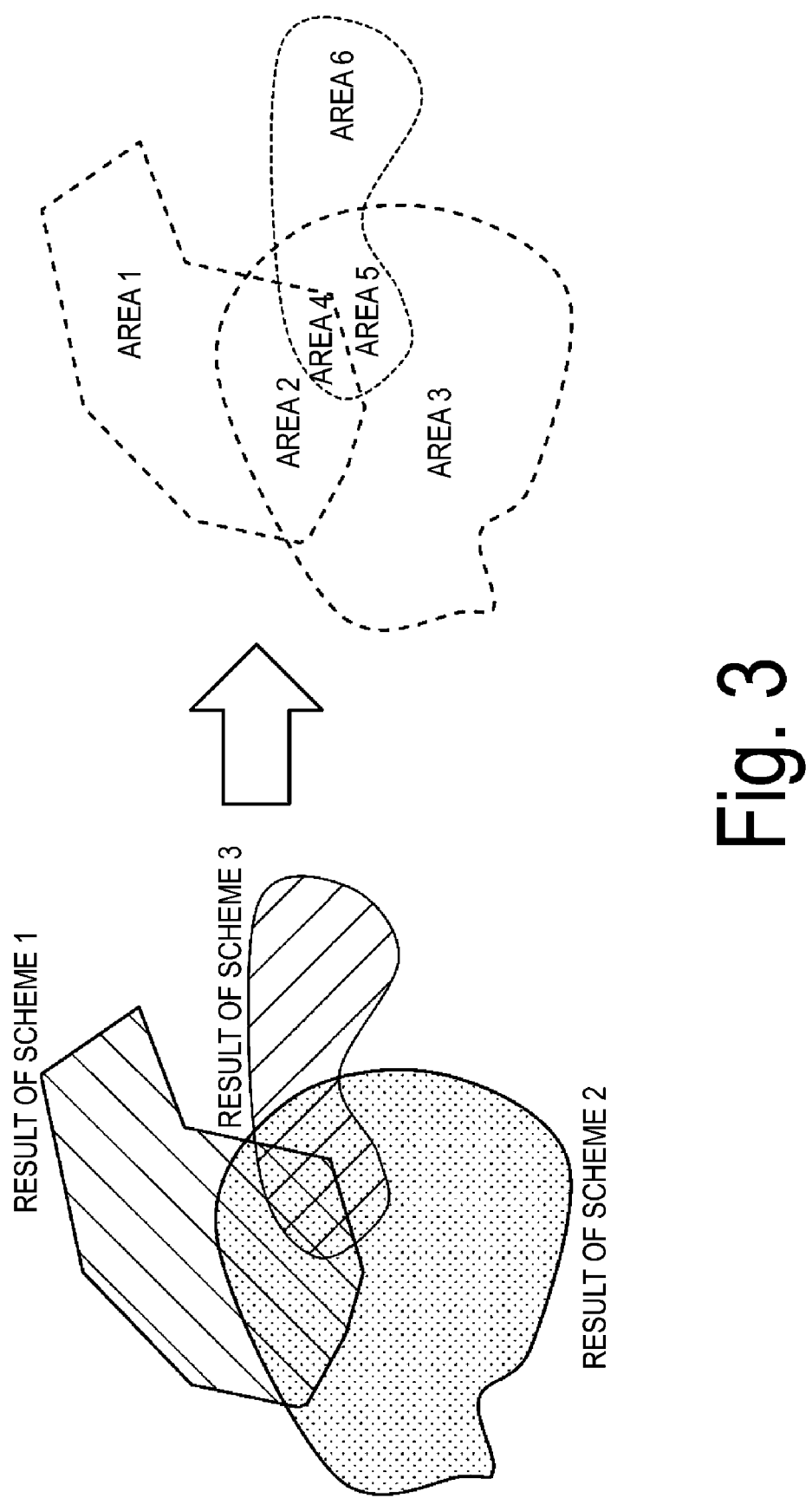
FIG. 3 is a diagram illustrating a method of generating a point cloud cluster.

Further, an area may be generated using three point cloud clusters, as illustrated in FIG. 3. For example, when the area indicating the point cloud cluster obtained using clustering scheme 1, the area indicating the point cloud cluster obtained using clustering scheme 2, and an area indicating a point cloud cluster obtained using clustering scheme 3 overlap, areas 1 to 6 that are over-divided areas, an area 4 that is an AND area, and an area that is a combination of the areas 1 to 6, which is an OR area, are obtained as a point cloud cluster, as in FIG. 2.

The cluster storage unit 28 stores the area obtained by the cluster area generation unit 26, that is, each point cloud cluster.

Figure 4:
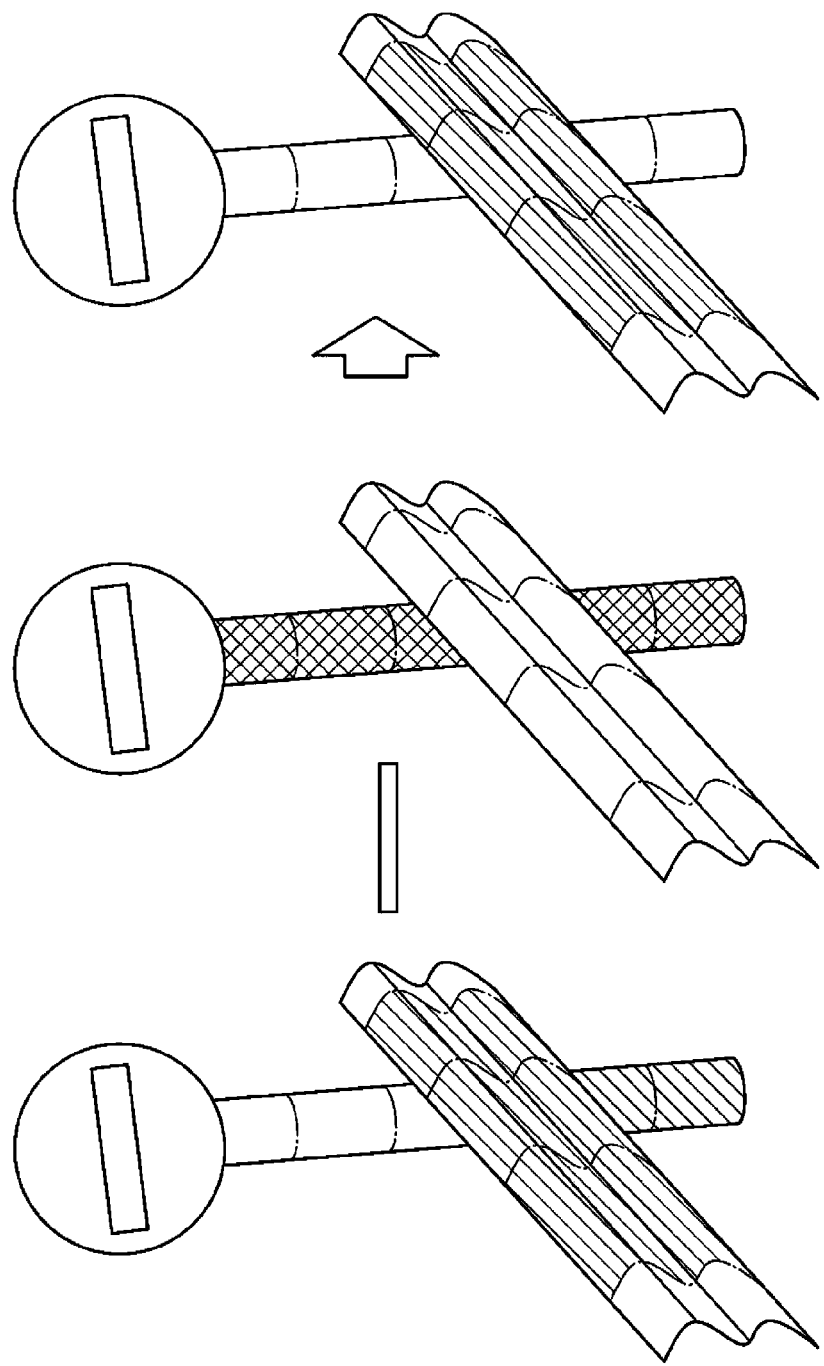
FIG. 4 is a diagram illustrating a method of editing a point cloud cluster.

The cluster editing unit 30 performs a process of interactively newly generating an area (point cloud cluster) through a manual operation of the user. The cluster editing unit 30 performs a process of removing an AND (overlapping) portion between the areas on the point cloud clusters stored in the cluster storage unit 28 through user designation operation on the GUI screen, as pre-processing before the annotation. For example, an area (point cloud cluster) obtained by removing an overlapping portion from a leftmost area (point cloud cluster) based on a middle area (see shaded points in FIG. 4) as illustrated in FIG. 4 is obtained. A result thereof is newly registered as a candidate cluster.

Figure 5:
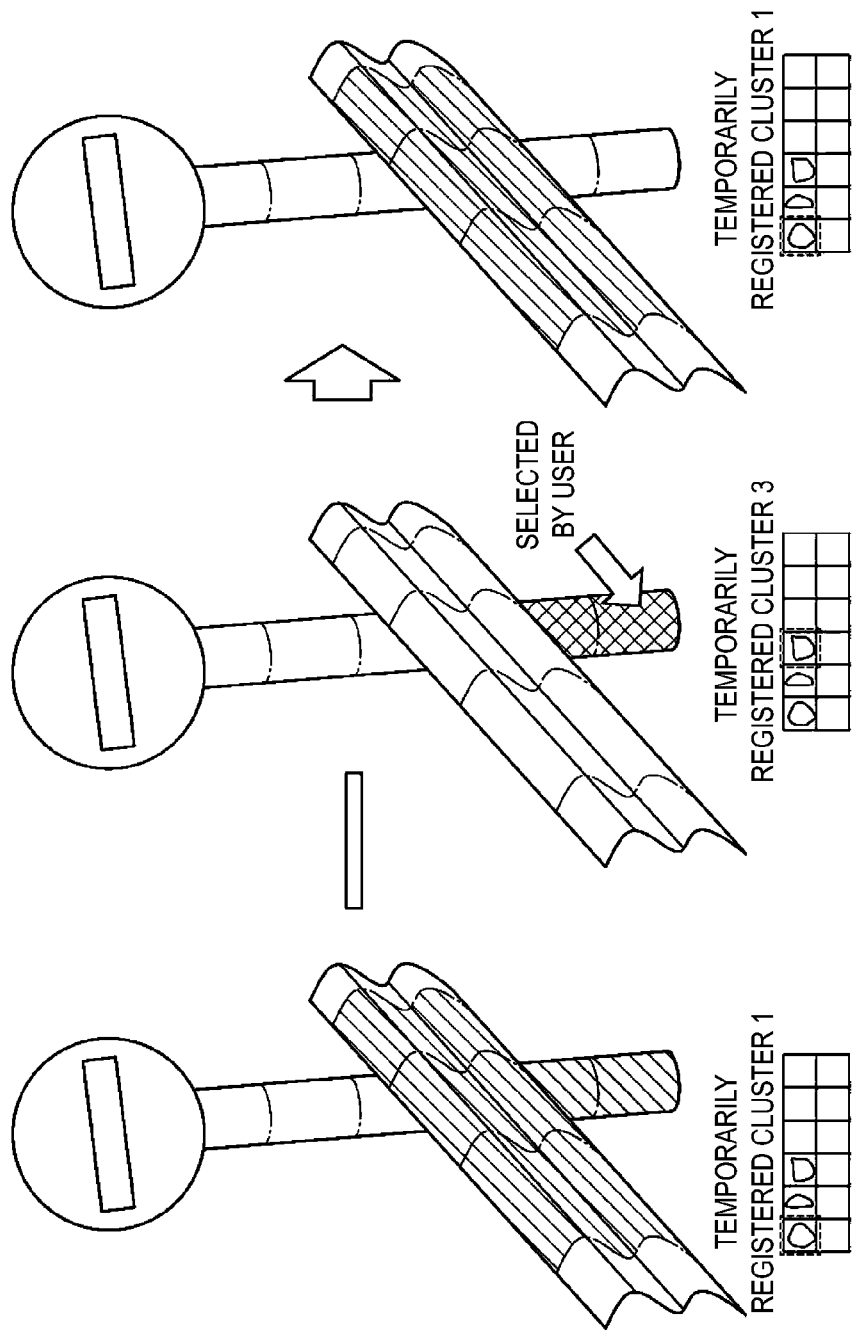
FIG. 5 is a diagram illustrating a method of editing a point cloud cluster.

Further, when a temporarily registered cluster to be described below is stored in the cluster storage unit 28, the cluster editing unit 30 may use the cluster editing unit 30 for the purpose of generating a new point cloud cluster during the annotation process. Specifically, the cluster editing unit 30 may remove a portion overlapping another designated temporarily registered cluster stored in the cluster storage unit 28 from the temporarily registered cluster based on user designation of the other temporarily registered cluster (see a shaded area in FIG. 5) on the GUI screen and register a resultant cluster as a new temporarily registered cluster (see FIG. 5).

Figure 6:
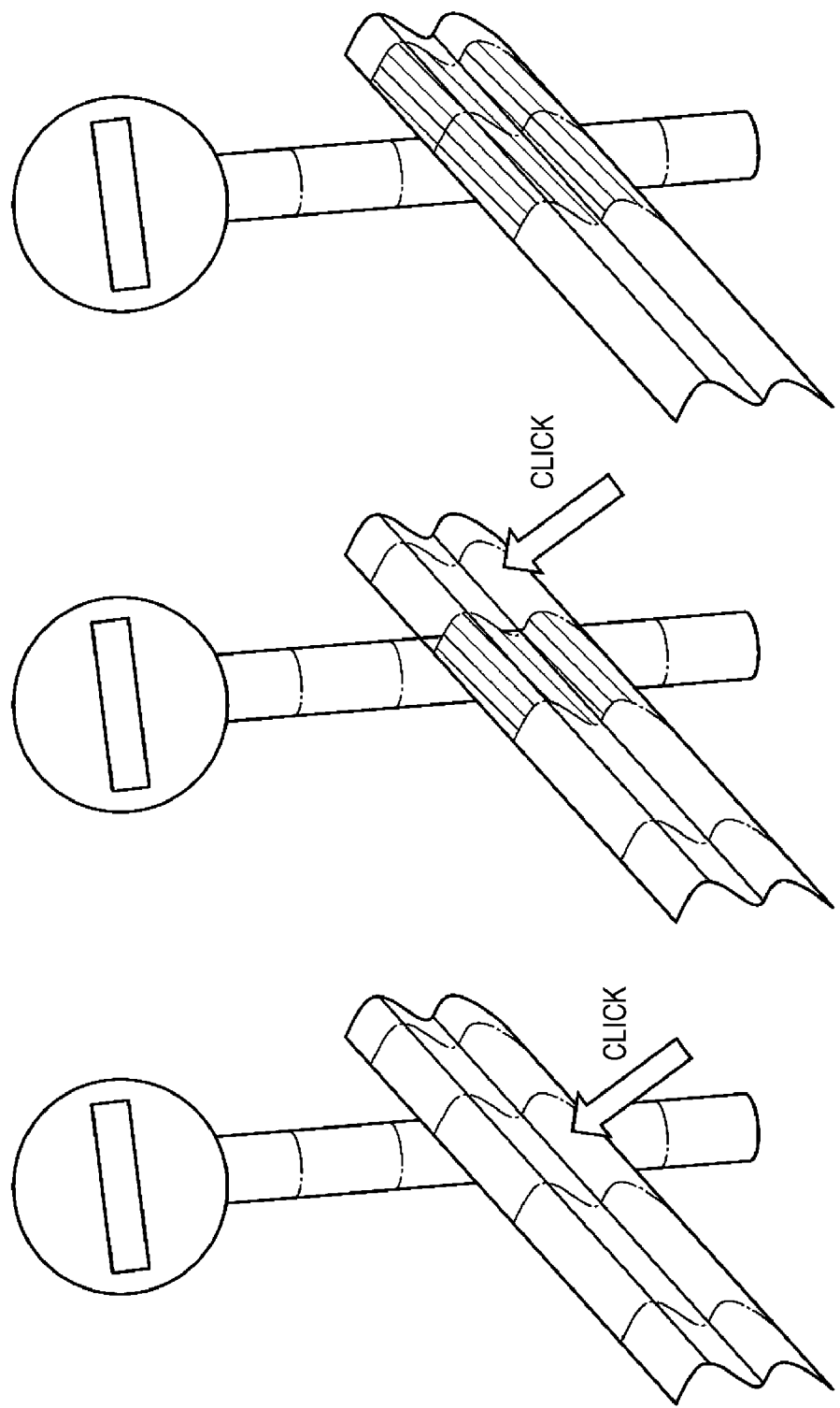
FIG. 6 is a diagram illustrating a method of editing a point cloud cluster.

Further, the cluster editing unit 30 has a function of realizing an editing operation of the user so that the designated point cloud clusters stored in the cluster storage unit 28 are integrated based on user designation of a plurality of point cloud clusters on the GUI screen displayed by the information presenting unit 90 (see FIG. 6). It is assumed that the point cloud is displayed in a grid and then, the area is divided in a grid pattern at regular intervals, as illustrated in FIG. 6. In this case, an area designated (clicked) by the user is sequentially added to the divided area (an OR process is performed) so that a new area can be generated.

Hereinafter, an annotation task is performed using the area (point cloud cluster) automatically generated by the cluster area generation unit 26 or generated through a manual operation by the cluster editing unit 30. It is not necessary to distinguish between the automatic area generation and the manual generation operation, and either function may be used. Further, in the following description, the point cloud cluster is used to specify the area.

The candidate cluster calculation unit 32 calculates a value of the evaluation function indicating the annotation target object for each of the point cloud clusters stored in the cluster storage unit 28 based on user designation of the three-dimensional point indicating the annotation target object and designation of the three-dimensional point not indicating the annotation target object on the GUI screen displayed by the information presenting unit 90.

In this case, the interface unit 22 causes the information presenting unit 90 to display the GUI screen for displaying the point clouds indicating the three-dimensional points on the object, and receives the designation of the three-dimensional point indicating the annotation target object and the designation of the three-dimensional point not indicating the annotation target object.

Further, the evaluation function outputs a greater value as the point cloud cluster includes more three-dimensional points indicating a designated annotation target object, and the evaluation function outputs a smaller value as the point cloud cluster includes more three-dimensional points not indicating the designated annotation target object. Specifically, a value obtained by adding a predetermined value according to the number of three-dimensional points indicating the designated annotation target object among the three-dimensional points included in the point cloud cluster and subtracting a predetermined value according to the number of three-dimensional points not indicating the designated annotation target object is used as the value of the evaluation function.

The cluster selection and storage designation unit 34 causes the information presenting unit 90 to display the GUI screen for displaying the point cloud clusters in descending order of the value of the evaluation function via the interface unit 22, and receives the designation of a point cloud cluster to be annotated.

The annotation execution unit 36 executes annotation for presenting the annotation target object for each three-dimensional point included in the designated point cloud cluster.

The annotation information storage unit 38 stores an annotation result for each three-dimensional point.

Each of the processes of the interface unit 22, the candidate cluster calculation unit 32, the cluster selection and storage designation unit 34, and the annotation execution unit 36 is repeated until a predetermined end condition is satisfied.

Figure 7:
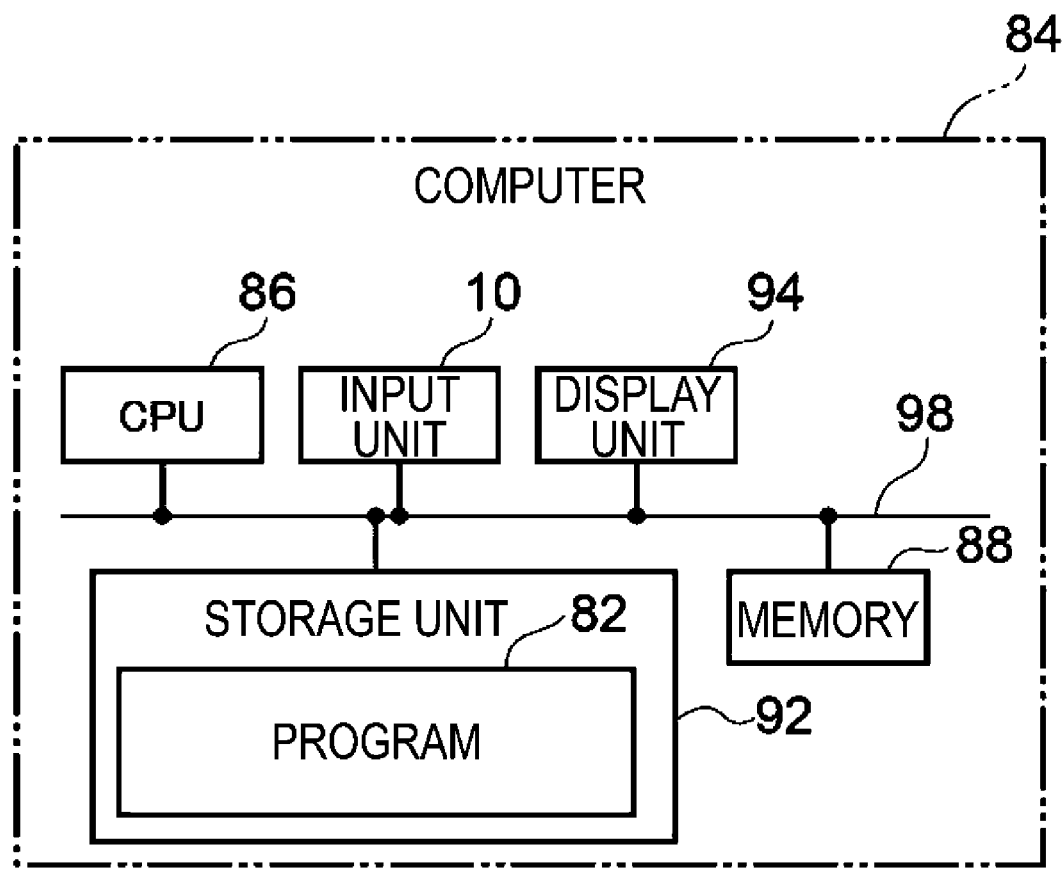
FIG. 7 is a schematic block diagram of an example of a computer that functions as a point cloud annotation device.

The point cloud annotation device 100 is realized by a computer 84 illustrated in FIG. 7 as an example. The computer 84 includes a CPU 86, a memory 88, a storage unit 92 that stores a program 82, a display unit 94 including a monitor, and the input unit 10 that includes a keyboard or a mouse. The CPU 86, the memory 88, the storage unit 92, the display unit 94, and the input unit 10 are connected to each other via a bus 98.

The storage unit 92 is realized by a HDD, an SSD, a flash memory, or the like. The program 82 for causing the computer 84 to function as the point cloud annotation device 100 is stored in the storage unit 92. The CPU 86 reads the program 82 from the storage unit 92, loads the program 82 into the memory 88, and executes the program 82. The program 82 may be provided by being stored in a computer-readable medium.

Operation of Point Cloud Annotation Device According to Present Embodiment

Figure 8:
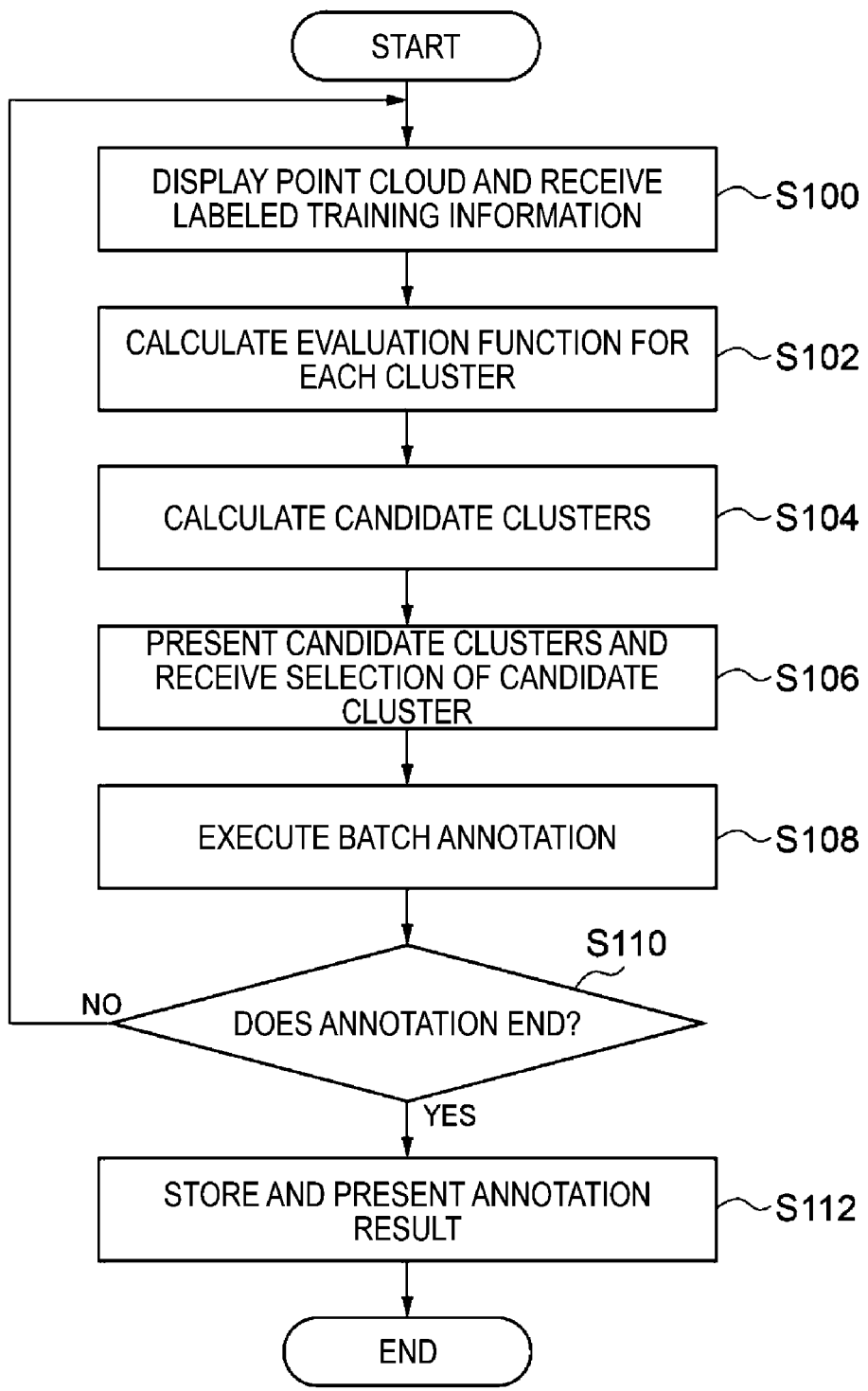
FIG. 8 is a flowchart illustrating an example of a flow of a point cloud annotation process that is executed by the point cloud annotation device according to the embodiment of the present invention.

Next, an operation of the point cloud annotation device 100 according to the present embodiment will be described with reference to FIG. 8. FIG. 8 illustrates a flowchart illustrating an example of a processing flow of the program 82 according to the embodiment.

First, a point cloud obtained by a vehicle including the device that measures a three-dimensional point cloud measuring a three-dimensional point cloud at each time while traveling is stored in the three-dimensional point cloud storage unit 24.

In the point cloud annotation device 100, clustering of the point clouds by the cluster area generation unit 26 and editing of the point cloud cluster by the cluster editing unit 30 are performed as pre-processing.

When the point cloud annotation device 100 is instructed to execute a point cloud annotation process through an operation of the user, the CPU 86 reads and executes the program 82 stored in the storage unit 92.

First, in step S100 of FIG. 8, the interface unit 22 causes the information presenting unit 90 to display the GUI screen indicating the point cloud, and the input unit 10 receives designation of the three-dimensional point indicating the annotation target object and designation of the three-dimensional point not indicating the annotation target object.

Figure 9:
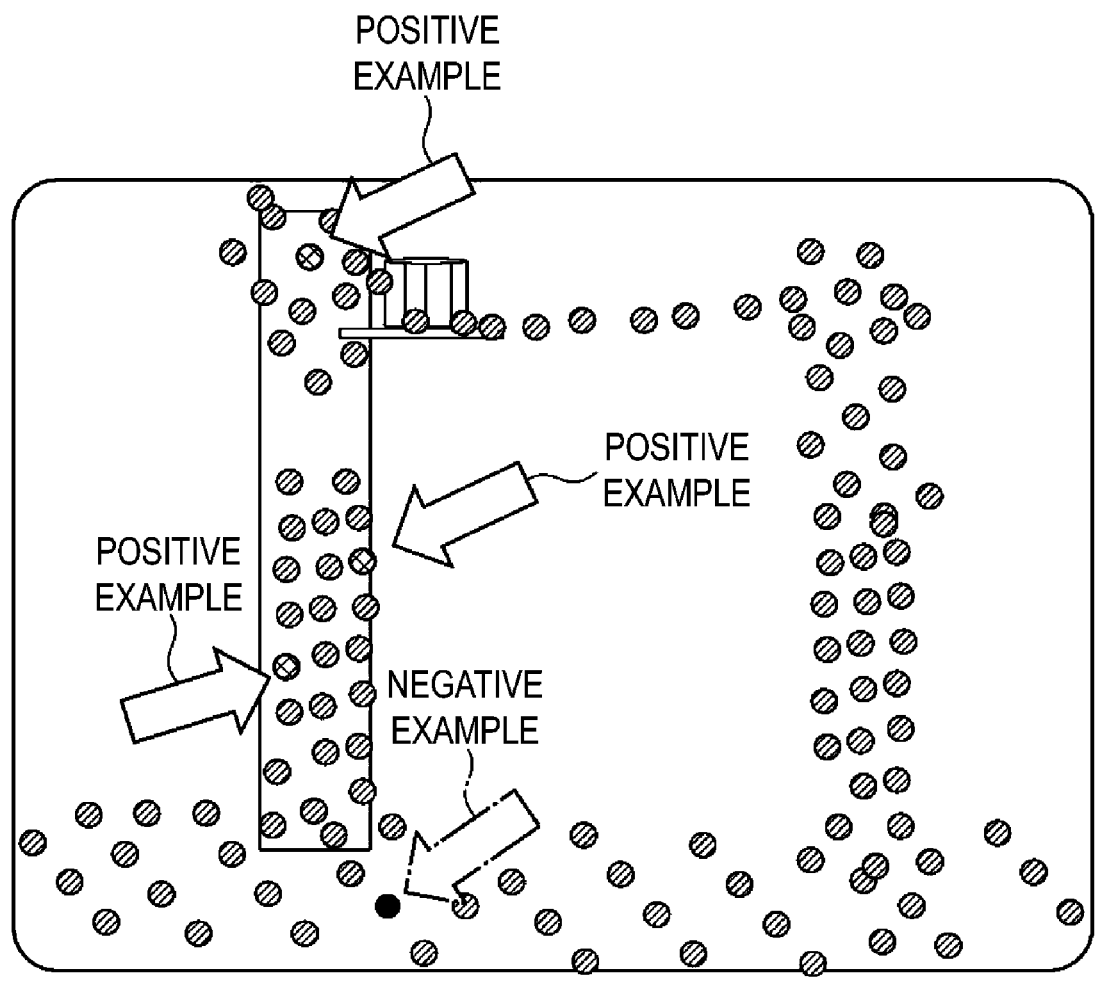
FIG. 9 is a diagram illustrating an example of a GUI screen that receives designation of a three-dimensional point.

For example, the user clicks on the three-dimensional point indicating the annotation target object (see a shaded point in FIG. 9) on a GUI screen illustrated in FIG. 9 and clicks on the three-dimensional point not indicating the annotation target object (see a black point in FIG. 9), so that the input unit 10 receives the designation of three-dimensional points as labeled training information.

In step S102, the candidate cluster calculation unit 32 calculates a value of the evaluation function for each of the point cloud clusters stored in the cluster storage unit 28 based on the user designation of the three-dimensional point indicating the annotation target object and the user designation of the three-dimensional point not indicating the annotation target object on the GUI screen displayed by the information presenting unit 90.

In step S104, the cluster selection and storage designation unit 34 extracts the point cloud clusters in descending order of the value of the evaluation function and sets the point cloud clusters as candidate clusters.

In step S106, the cluster selection and storage designation unit 34 causes the information presenting unit 90 to display the GUI screen for displaying the candidate clusters in descending order of the value of the evaluation function via the interface unit 22, and receives the selection of candidate clusters indicating annotation target objects using the input unit 10.

Figure 10:
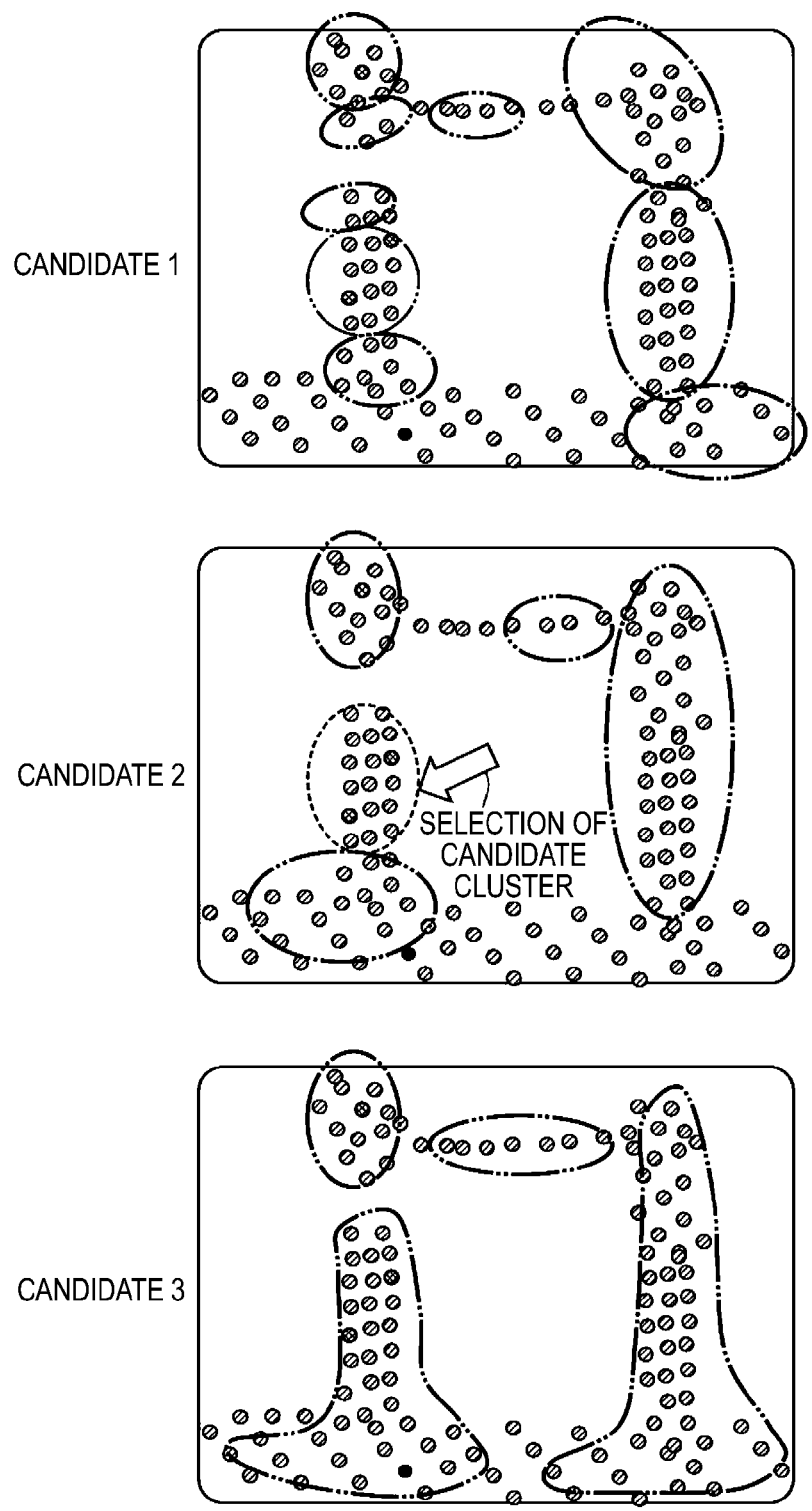
FIG. 10 is a diagram illustrating an example of a GUI screen that receives selection of a point cloud cluster.

For example, candidate clusters are displayed on a GUI screen illustrated in FIG. 10 in descending order of the value of the evaluation function. Each candidate cluster is displayed together with a clustering result in the clustering scheme in which the candidate cluster has been obtained. On the GUI screen, the user clicks on the candidate cluster so that the selection of the candidate cluster indicating the annotation target object is received.

In step S108, the annotation execution unit 36 executes the annotation indicating the annotation target object for each three-dimensional point included in the selected candidate cluster.

Figure 11:
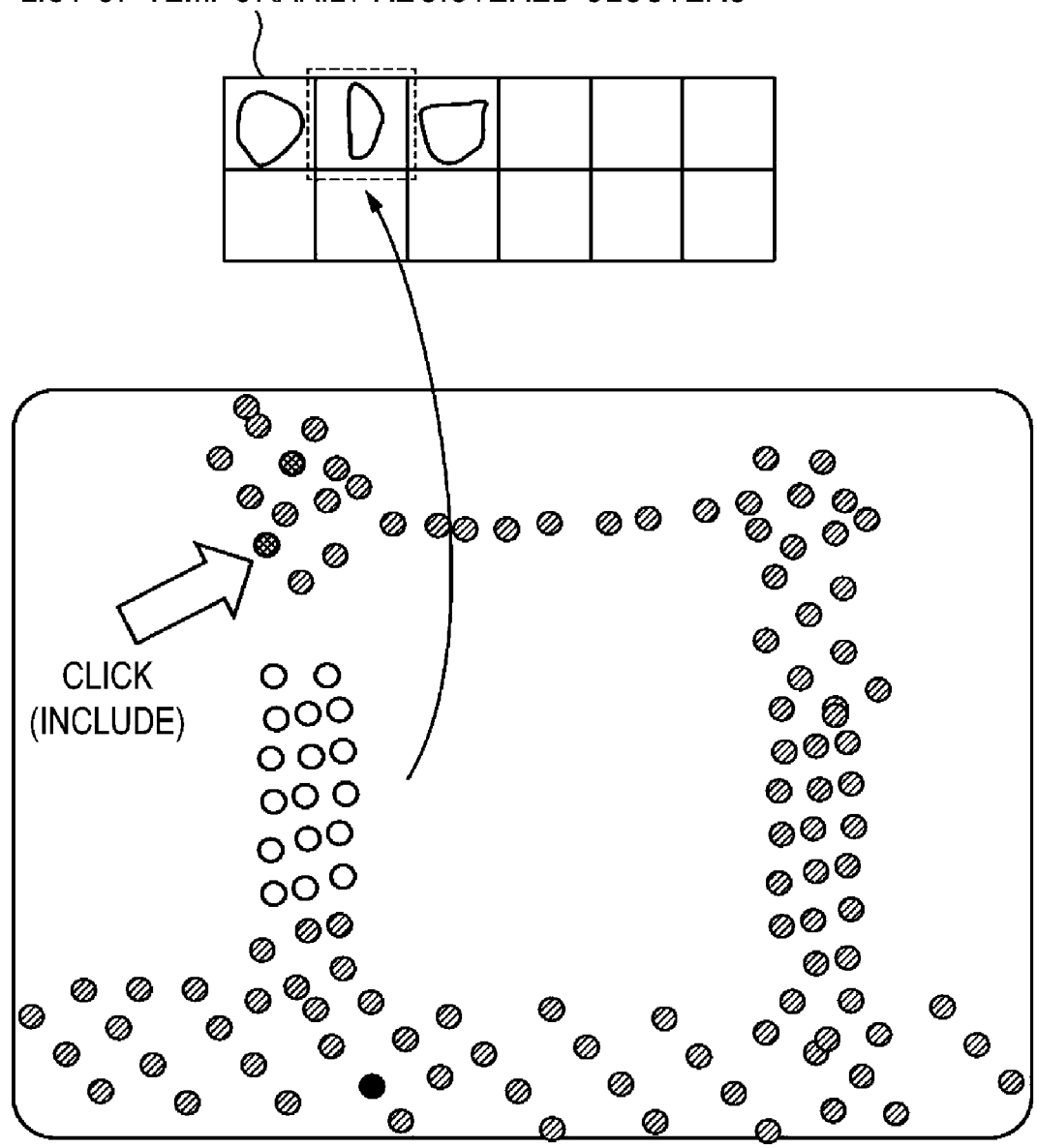
FIG. 11 is a diagram illustrating a method of registering a registered cluster and an example of a GUI screen that receives and designation of a three-dimensional point.

For example, the annotation execution unit 36 executes an annotation indicating an annotation target object for each three-dimensional point (see a white point in FIG. 11) included in the selected candidate cluster and registers the candidate cluster as a temporarily registered cluster indicating the annotation target object, as illustrated in FIG. 11.

In step S110, a determination is made as to whether or not the predetermined end condition is satisfied and, when the end condition is not satisfied, the process returns to step S100 and the input unit 10 receives the designation of the three-dimensional point as labeled training information again. On the other hand, when the end condition is satisfied, the process proceeds to step S112.

Figure 12:
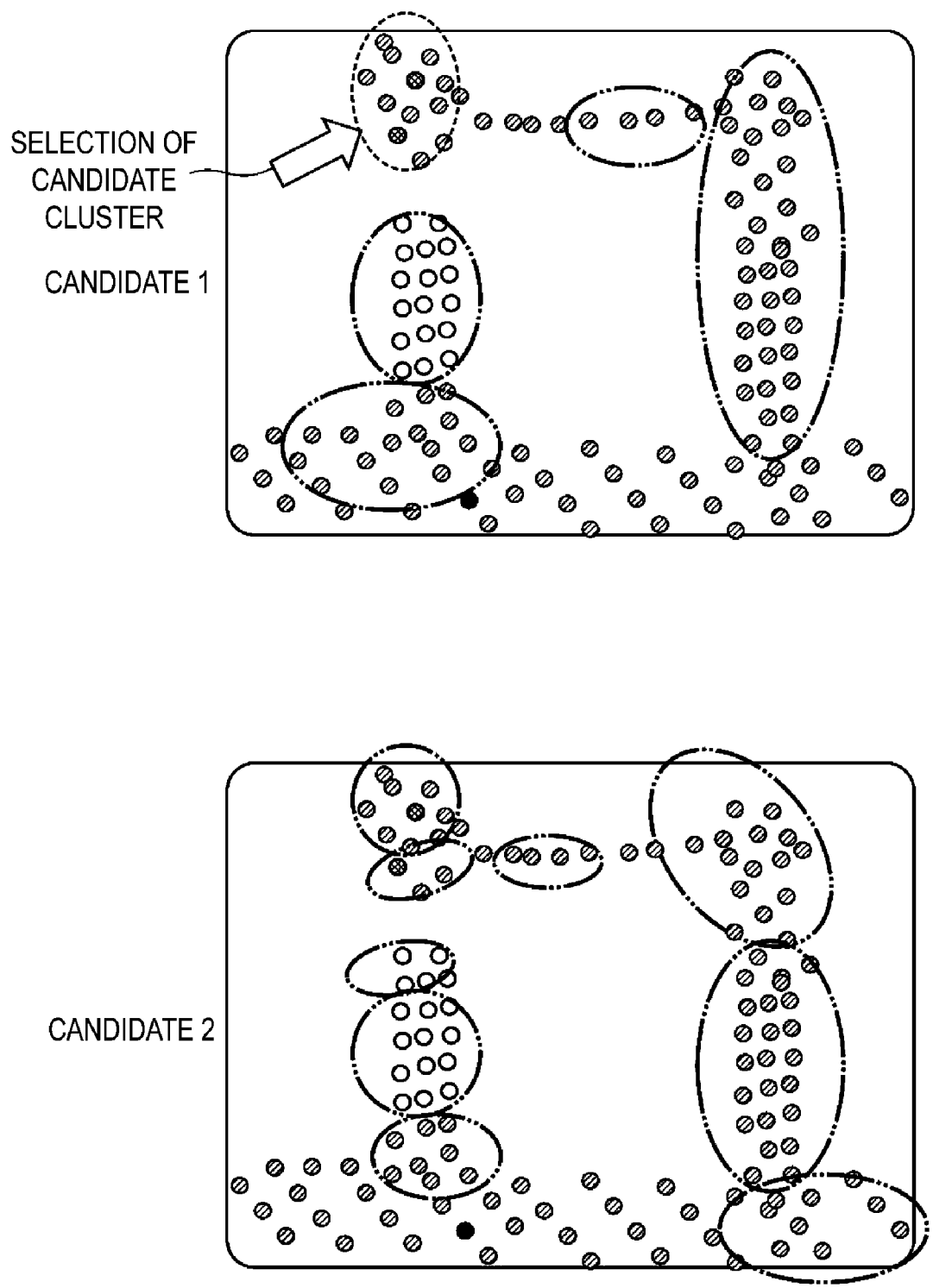
FIG. 12 is a diagram illustrating an example of a GUI screen that receives selection of a point cloud cluster.

When the input unit 10 receives the designation of the three-dimensional point as labeled training information again, the input unit 10 receives the designation of the three-dimensional point as labeled training information by the user additionally clicking on the three-dimensional point indicating the annotation target object on the GUI screen (see a shaded point in FIG. 11), as illustrated in FIG. 11, for example. Candidate clusters are displayed on the GUI screen illustrated in FIG. 12 in descending order of the value of the evaluation function calculated based on the additionally designated three-dimensional point, and the input unit 10 receives the selection of the candidate cluster indicating the annotation target object by the user clicking on the candidate cluster on the GUI screen.

Figure 13:
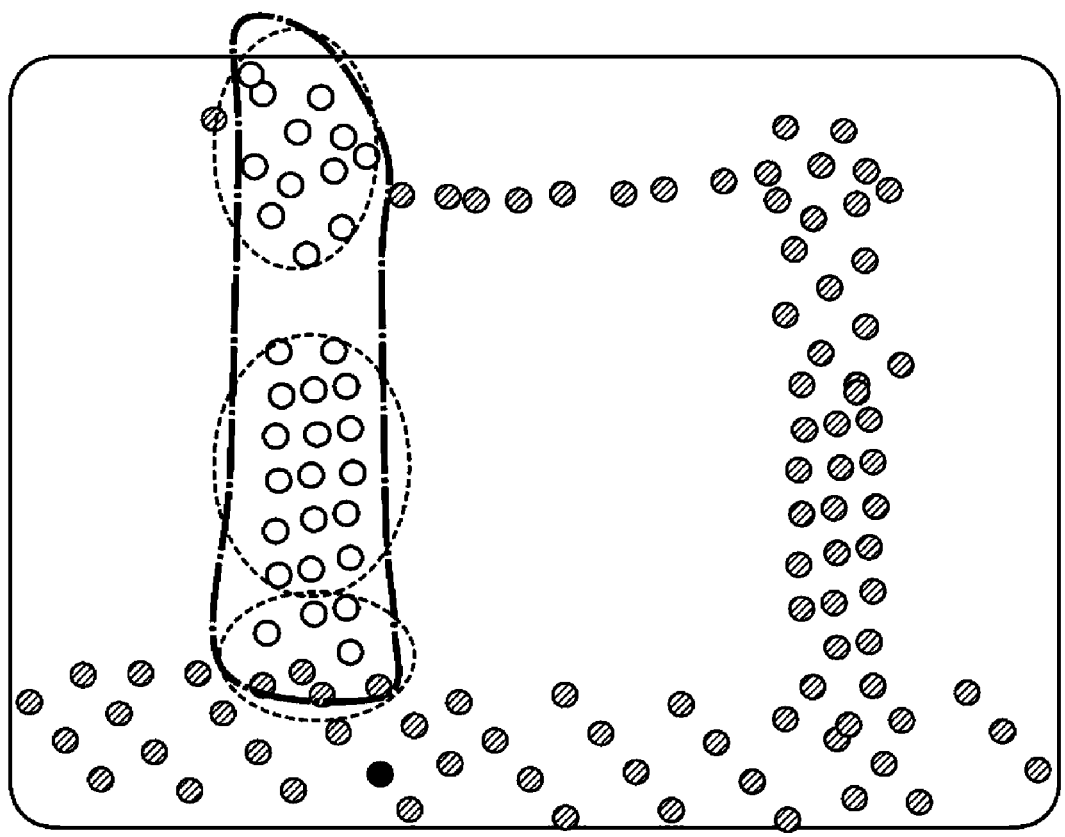
FIG. 13 is a diagram illustrating an example of a GUI screen for displaying an annotation result.

In step S112, a point cloud consisting of three-dimensional points to which an annotation indicating the annotation target object is imparted (see a point cloud consisting of outlined white points in FIG. 13) is stored in the annotation information storage unit 38, and the OR area of the temporarily registered cluster indicating the annotation target object is stored in the annotation information storage unit 38 as a registered cluster. Further, the information presenting unit 90 is caused to display a GUI screen for displaying the annotation result via the interface unit 22 (see FIG. 13).

As described above, the point cloud annotation device 100 of the present embodiment displays the point clouds indicating the three-dimensional points on the object. The point cloud annotation device 100 receives the designation of the three-dimensional point indicating the annotation target object and the designation of the three-dimensional point not indicating the annotation target object, and calculates the value of the predetermined evaluation function indicating a likelihood of a point cloud cluster being the annotation target based on the designation of a three-dimensional point for point cloud clusters. The point cloud annotation device 100 then causes the point cloud clusters to be displayed in descending order of the value of the evaluation function, and receives a selection of a point cloud cluster to be annotated. The point cloud annotation device 100 executes an annotation for each of the three-dimensional points included in the selected point cloud cluster. This enables the user to easily perform annotation on the three-dimensional point cloud and reduce working time.

The present embodiment is an example, and it is obvious that the specific configuration is not limited to the present embodiment, includes a design and the like within a range that does not depart from the gist of the present invention, and can be changed depending on a situation.

For example, the case in which the facilities around the road are used as the annotation target objects has been described as an example, but the present invention is not limited thereto and objects other than the facilities around the road may be used as the annotation target objects.

REFERENCE SIGNS LIST

10 Input unit
20 Calculation unit
22 Interface unit
24 Three-dimensional point cloud storage unit
26 Clustering unit
28 Cluster storage unit
30 Cluster editing unit
32 Candidate cluster calculation unit
34 Cluster selection and storage designation unit
36 Annotation execution unit
38 Annotation information storage unit
82 Program
84 Computer
100 Point cloud annotation device

The invention claimed is:

1. A point cloud annotation device comprising a processor configured to execute operations comprising:
displaying point clouds, wherein the point clouds comprise a plurality of three-dimensional points;

interactively receiving designation of a first three-dimensional point of the plurality of three-dimensional points and a second three-dimensional point of the plurality of three-dimensional points, wherein the first three-dimensional point indicates an annotation target object and represents a positive example, and the second three-dimensional point excludes indication of the annotation target object and represents a negative example;
generating a plurality of point cloud clusters in the point clouds;
determining a value of a predetermined evaluation function of a point cloud cluster of the plurality of point cloud clusters, wherein the value of the predetermined evaluation function indicates a likelihood of a point cloud cluster being the annotation target object, based on the first three-dimensional point as the positive example and the second three-dimensional point as the negative example;
causing an interface processor to display the plurality of point cloud clusters in descending order of the value of the predetermined evaluation function;
interactively receiving a selection of the point cloud cluster of the plurality of point cloud clusters to be annotated; and
executing an annotation indicating the annotation target object for each three-dimensional point included in the point cloud cluster.

2. The point cloud annotation device according to claim 1, wherein the predetermined evaluation function outputs a greater value as the point cloud cluster includes more three-dimensional points indicating the annotation target object, and the predetermined evaluation function further outputs a smaller value as the point cloud cluster includes more three-dimensional points not indicating the annotation target object.

3. The point cloud annotation device according to claim 2, wherein the point cloud cluster is obtained from a result of clustering the point cloud using a plurality of clustering schemes.

4. The point cloud annotation device according to claim 2, the processor further configured to execute operations comprising:
repeating a set of operations until a predetermined condition is satisfied, wherein the set of operations including:
the receiving designation,
the determining a value of the predetermined evaluation function,
the receiving a selection of a point cloud cluster to be annotated, and
the executing one or more annotations based on the received selection.

5. The point cloud annotation device according to claim 1, wherein the point cloud cluster is obtained from a result of clustering the point clouds using a plurality of clustering schemes.

6. The point cloud annotation device according to claim 5, the processor further configured to execute operations comprising:
repeating a set of operations until a predetermined condition is satisfied, wherein the set of operations including:
the receiving designation,
the determining a value of the predetermined evaluation function,
the receiving a selection of a point cloud cluster to be annotated, and
the executing one or more annotations based on the received selection.

7. The point cloud annotation device according to claim 1, the processor further configured to execute operations comprising:
repeating a set of operations until a predetermined condition is satisfied, wherein the set of operations including:
the receiving designation,
the determining a value of the predetermined evaluation function,
the receiving a selection of a point cloud cluster to be annotated, and
the executing one or more annotations based on the received selection.

8. A point cloud annotation method comprising:
displaying point clouds, wherein the point clouds comprise a plurality of three-dimensional points;
interactively receiving designation of a first three-dimensional point of the plurality of three-dimensional points and a second three-dimensional point of the plurality of three-dimensional points, wherein the first three-dimensional point indicates an annotation target object and represents a positive example, and the second three-dimensional point excludes indication of the annotation target object and represents a negative example;
generating a plurality of point cloud clusters in the point clouds;
determining a value of a predetermined evaluation function of a point cloud cluster of the plurality of point cloud clusters, indicating a likelihood of a point cloud cluster being the annotation target object, based on the first three-dimensional point as the positive example and the second three-dimensional point as the negative example;
causing the interactive processor to display the plurality of point cloud clusters in descending order of the value of the predetermined evaluation function;
interactively receiving a selection of the point cloud cluster of the plurality of point cloud clusters to be annotated; and
executing an annotation indicating the annotation target object for each three-dimensional point included in the point cloud cluster.

9. The point cloud annotation method according to claim 8, wherein the predetermined evaluation function outputs a greater value as the point cloud cluster includes more three-dimensional points indicating an annotation target object, and the predetermined evaluation function further outputs a smaller value as the point cloud cluster includes more three-dimensional points not indicating the annotation target object.

10. The point cloud annotation method according to claim 9, wherein the point cloud cluster is obtained from a result of clustering the point cloud using a plurality of clustering schemes.

11. The point cloud annotation method according to claim 9, further comprising:
repeating a set of operations until a predetermined condition is satisfied, wherein the set of operations including:
the receiving designation,
the determining a value of the predetermined evaluation function, the receiving a selection of a point cloud cluster to be annotated, and the executing one or more annotations based on the received selection.

12. The point cloud annotation method according to claim 8, wherein the point cloud cluster is obtained from a result of clustering the point cloud using a plurality of clustering schemes.

13. The point cloud annotation method according to claim 12, further comprising:

repeating a set of operations until a predetermined condition is satisfied, wherein the set of operations including:

the receiving designation, the determining a value of the predetermined evaluation function, the receiving a selection of a point cloud cluster to be annotated, and the executing one or more annotations based on the received selection.

14. The point cloud annotation method according to claim 8, further comprising:

repeating a set of operations until a predetermined condition is satisfied, wherein the set of operations including:

the receiving designation, the determining a value of the predetermined evaluation function, the receiving a selection of a point cloud cluster to be annotated, and the executing one or more annotations based on the received selection.

15. A computer-readable non-transitory recording medium storing computer-executable program instructions that when executed by a processor cause a computer system to execute operations comprising:

displaying point clouds, wherein the point clouds comprise a plurality of three-dimensional points;

interactively receiving designation of a first three-dimensional point of the plurality of three-dimensional points and a second three-dimensional point of the plurality of three-dimensional points, wherein the first three-dimensional point indicates an annotation target object and represents a positive example, and the second three-dimensional point excludes indication of the annotation target object and represents a negative example;

generating a plurality of point cloud clusters in the point clouds;

determining a value of a predetermined evaluation function of a point cloud cluster of the plurality of point cloud clusters, wherein the value of the predetermined evaluation function indicates a likelihood of a point cloud cluster being the annotation target object, based on the first three-dimensional point as the positive example and the second three-dimensional point as the negative example;

interactively receiving a selection of the point cloud cluster of the plurality of point cloud clusters to be annotated; and executing, an annotation indicating the annotation target object for each three-dimensional point included in the point cloud cluster.

16. The computer-readable non-transitory recording medium of claim 15, wherein the predetermined evaluation function outputs a greater value as the point cloud cluster includes more three-dimensional points indicating an annotation target object, and the predetermined evaluation function further outputs a smaller value as the point cloud cluster includes more three-dimensional points not indicating the annotation target object.

17. The computer-readable non-transitory recording medium of claim 16, wherein the point cloud cluster is obtained from a result of clustering the point cloud using a plurality of clustering schemes.

18. The computer-readable non-transitory recording medium of claim 15, wherein the point cloud cluster is obtained from a result of clustering the point cloud using a plurality of clustering schemes.

19. The computer-readable non-transitory recording medium of claim 18, the computer-executable program instructions that when executed by the processor further cause the computer system to execute operations comprising:

repeating a set of operations until a predetermined condition is satisfied, wherein the set of operations including:

the receiving designation, the determining a value of the predetermined evaluation function, the receiving a selection of a point cloud cluster to be annotated, and the executing one or more annotations based on the received selection.

20. The computer-readable non-transitory recording medium of claim 15, the computer-executable program instructions that when executed by the processor further cause the computer system to execute operations comprising:

repeating a set of operations until a predetermined condition is satisfied, wherein the set of operations including:

the receiving designation, the determining a value of the predetermined evaluation function, the receiving a selection of a point cloud cluster to be annotated, and the executing one or more annotations based on the received selection.

* * * * *